US008569786B2

(12) United States Patent
Takei et al.

(10) Patent No.: US 8,569,786 B2
(45) Date of Patent: Oct. 29, 2013

(54) LIGHT EMITTING DEVICE AND ILLUMINATION DEVICE

(75) Inventors: Haruki Takei, Yokosuka (JP); Seiko Kawashima, Yokosuka (JP); Masahiro Izumi, Yokosuka (JP); Akiko Saito, Yokosuka (JP); Yusuke Shibahara, Yokosuka (JP); Tsuyoshi Oyaizu, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 218 days.

(21) Appl. No.: 13/105,868

(22) Filed: May 11, 2011

(65) Prior Publication Data

US 2011/0278632 A1 Nov. 17, 2011

(30) Foreign Application Priority Data

May 11, 2010 (JP) ................................. 2010-109407

(51) Int. Cl.
*H01L 33/62* (2010.01)

(52) U.S. Cl.
USPC ........ 257/99; 257/79; 257/103; 257/E51.018; 257/E33.066; 257/E33.077

(58) Field of Classification Search
USPC .................................... 257/13, 79–103, 918, 257/E51.018–E51.022, E33.001–E33.077, 257/E33.054, E25.028, E25.032
See application file for complete search history.

(56) References Cited

U.S. PATENT DOCUMENTS

| | | | | |
|---|---|---|---|---|
| 2010/0072923 | A1* | 3/2010 | Holland et al. | 315/363 |
| 2011/0140136 | A1* | 6/2011 | Daily et al. | 257/89 |

FOREIGN PATENT DOCUMENTS

| | | |
|---|---|---|
| CN | 201212632 | 3/2009 |
| JP | 2003-059330 | 12/2003 |
| JP | 2008-227412 | 9/2008 |
| JP | 2009-037995 | 12/2009 |

OTHER PUBLICATIONS

Chinese Office Action issued in CN 201110119649 on Aug. 24, 2012.
English Language Translation of Chinese Office Action issued in CN 201110119649 on Aug. 24, 2012.
English Language Abstract of CN 201212632 published Mar. 25, 20009.
English Language Abstract of JP 2008-227412 published Sep. 25, 2008.
English Language Translation of JP 2008-227412 published Sep. 25, 2008.
English Language Abstract of JP 2003-059330 published Feb. 28, 2003.
English Language Translation of JP 2003-059330 published Feb. 28. 2003.
English Language Abstract of JP 2009-037995 Published Feb. 19, 2009.
English Language Translation of JP 2009-037995 Published Feb. 19. 2009.

* cited by examiner

*Primary Examiner* — Mamadou Diallo
(74) *Attorney, Agent, or Firm* — DLA Piper LLP (US)

(57) ABSTRACT

According to one embodiment, a light emitting device includes a substrate, a light emitting element and connectors. The substrate has a surface and a back face, and power supply terminals are formed on the surface. The light emitting element is mounted on the surface of the substrate. The connector includes a contact portion coming into contact with the power supply terminal on the surface side of the substrate and a connector terminal having a wire connection portion projecting on the back face side of the substrate, and a power supply wire is connected to the wire connection portion of the connector terminal.

3 Claims, 8 Drawing Sheets

(a)

(b)

(a)

(b)

(c)

(a)

(b)

| COMPARISON | CONVENTION 1 | EXAMPLE 1 | EXAMPLE 2 | EXAMPLE 3 |
|---|---|---|---|---|
| WIRING DIRECTION | LATERAL | DOWNWARD | DOWNWARD | DOWNWARD |
| HEIGHT OF CONNECTOR (mm) | 4 | 4 | 2 | 2 |
| SHAPE OF RESIN ON WIRE SIDE | — | ROUND | ROUND | FOUR-SIDED |
| LIGHT EMISSION EFFICIENCY (%) | 100 | 102 | 105 | 105 |
| WORKABILITY | × | × | × | ○ |

FIG. 8

LIGHT EMITTING DEVICE AND ILLUMINATION DEVICE

INCORPORATION BY REFERENCE

The present invention claims priority under 35 U.S.C. §119 to Japanese Patent Application No. 2010-109407 filed on May 11, 2010. The content of the application is incorporated herein by reference in their entirety.

FIELD

Embodiments described herein relate generally to light emitting device using a light emitting element as a light source, and an illumination apparatus using the light emitting device.

BACKGROUND

The life of a light emitting diode (LED), defined as time that elapses until the luminous flux maintenance factor lowers to 70%, exceeds 40000 hours (normal hours). Light emitting devices using LEDs as light emitting elements have been recently developed. For example, these devices can include a light source of an illumination apparatus such as a self-ballasted LED lamp, downlight or spotlight, the LED lamp being interchangeable with an incandescent bulb; a backlight of a thin shape television, liquid crystal display, mobile phone or various types of information terminals; and an indoor/outdoor signboard advertisement. Since the light emitting device has a long life, low consumption power, impact resistance, high responsiveness and high purity display color, it has been applied not only to general illumination apparatuses but also to industrial illumination apparatuses.

Light emitting devices using LEDs may be required to emit a large amount of light and have high efficiency, and may be further required to have high heat radiation performance so that they may be made compact. Additionally, a light emitting device is required to have heat resistance when it is being used for guide lights or emergency lights. In order to provide these characteristics, a substrate made of metal such as aluminum or a substrate made of ceramics such as alumina is used as a substrate on which LEDs are mounted. Such substrates excellent in thermal conductivity.

Typically a connector is used with aluminum and ceramic substrates as an electrically connecting unit of a substrate, and solder is used to form an electric connection of the connector to the substrate and an electric connection of the connector to a power supply wire. The ceramic substrate radiates a slight amount of outgas, and thus the junction temperature can be raised. However, solder is typically required to be set to 90° C. or lower in temperature to ensure reliability of the solder. Therefore, the junction temperature cannot be raised and sufficient heat resistance cannot be obtained.

Thus, a solderless electrically connecting unit is required to allow for raising the junction temperature. On the other hand, in a solderless electric connection, shadows of a connector and a wire fall on a light emitting face, light is absorbed, light emission efficiency is lowered, and light distribution is disrupted.

It is an object of the present invention to provide a light emitting device capable of improving heat resistance and light emission efficiency, and an illumination apparatus using the light emitting device.

BRIEF DESCRIPTION OF THE DRAWINGS

FIG. 8 is a table indicating comparison results of light emission efficiency and workability of Convention 1 and those of Examples 1 to 3.

DETAILED DESCRIPTION

A light emitting device of the present embodiment includes a substrate, a light emitting element and connectors. The substrate has a surface and a back face, and power supply terminals are formed on the surface. The light emitting element is mounted on the surface of the substrate. The connector includes a connector terminal having a contact portion coming into contact with the power supply terminal on the surface side of the substrate and a wire connection portion projecting on the back face side of the substrate, and a power supply wire is connected to the wire connection portion of the connector terminal.

Next, a first embodiment will be described with reference to FIGS. 1 to 3.

Figure 1:
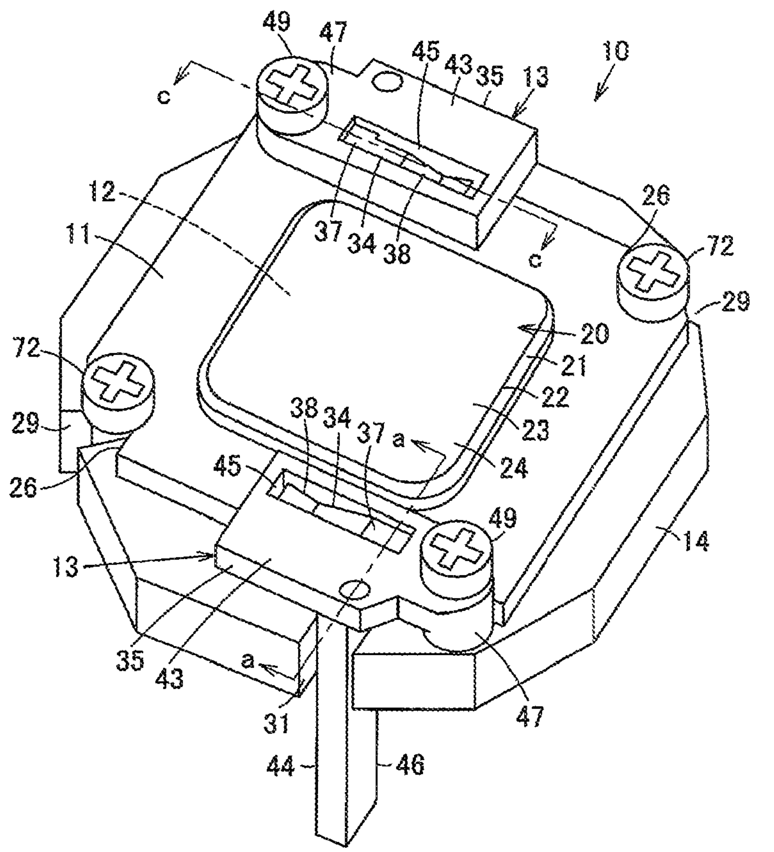
FIG. 1 shows a light emitting device of a first embodiment, FIG. 1(*a*) is a perspective view of the light emitting device and FIG. 1(*b*) is a perspective view of a connector terminal.
Figure 1:
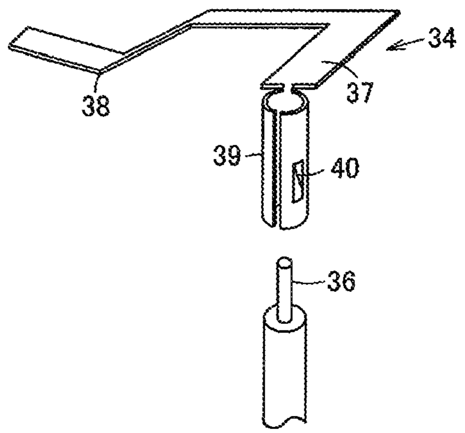
Figure 2:
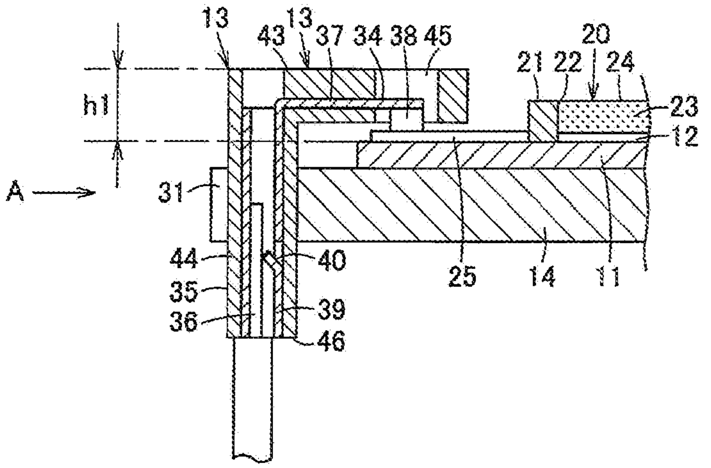
FIG. 2 shows the light emitting device, FIG. 2(*a*) is a cross sectional view taken along line a-a in FIG. 1(*a*), FIG. 2(*b*) is an enlarged cross sectional view schematically showing a power supply terminal and FIG. 2(*c*) is a cross sectional view taken along line c-c in FIG. 1(*a*).
Figure 2:
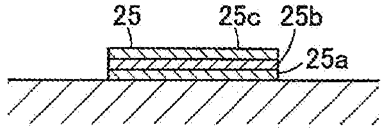
Figure 2:
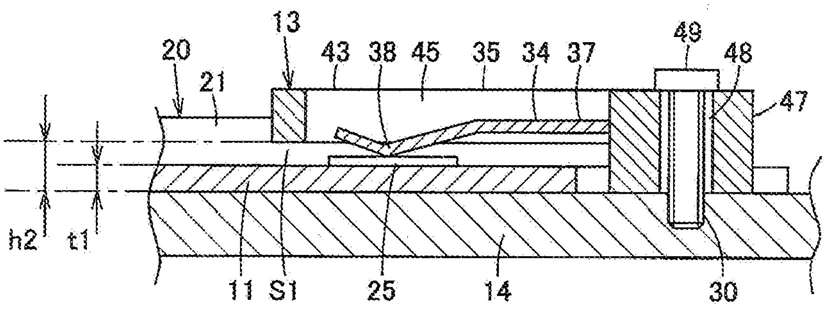

As shown in FIGS. 1 and 2, a light emitting device 10 includes a substrate 11, a light emitting element 12 mounted on a surface 11*a* of the substrate 11, connectors 13 connected to the substrate 11 and a support body 14 for supporting the substrate 11 and the connectors 13.

The substrate 11 is made of ceramics such as alumina having thermal conductivity and insulativity, and formed in the shape of a thin flat plate for which four corners are cut and which is approximately square. The substrate 11 has the surface 11*a* and a back face 11*b* opposite from the surface 11*a*, and the back face 11*b* is closely attached to the support body 14.

A light emitting portion 20 is formed on the surface 11*a* of the substrate 11. In the light emitting portion 20, a bank portion 21 having an approximately square annular shape is formed and an approximately square housing recess portion 22 is formed inside the bank portion 21. A wiring pattern (not shown) composed of copper foil is formed on the surface 11*a*, which includes a bottom face of the housing recess portion 22, of the substrate 11. Here, since the substrate 11 is composed of ceramics and has insulativity, electrical insulation is not required to be performed between the wiring pattern and the substrate, thereby providing an advantage in terms of cost.

In the embodiment, LEDs are used as the light emitting element 12, particularly, blue LED chips each having high brightness and high output performance are used. A plurality of LEDs are mounted, in a matrix shape, on the wiring pattern on the surface 11*a* of the substrate 11 (the bottom face of the housing recess portion 22) with use of COB (Chip On Board) technology. Each LED on the substrate 11 is connected to the wiring pattern by bonding wires, and the plurality of LEDs are electrically connected in series. Sealing matter 23, in which yellow fluorescent matter is dispersed and mixed, is applied to the housing recess portion 22 on the substrate 11, or the housing recess portion 22 is filled with the sealing matter 23. Blue light is radiated from the blue LED chips, the yellow fluorescent matter is excited by a part of the blue light to emit yellow light, the blue light and yellow light penetrating the sealing matter 23 are mixed, and white light is radiated from a surface of the sealing matter 23. That is, white light is radiated from a light emitting face 24 of a surface of the light emitting portion 20.

As shown in FIGS. 2(*a*) and 2(*c*), a pair of power supply terminals 25 extending from the wiring pattern to both side edge portions of the substrate 11 is formed on the surface 11*a* of the substrate 11. As shown in FIG. 2(*b*), in each power supply terminal 25, a silver (Ag) layer 25*a* is formed on the ceramic substrate 11, a nickel (Ni) layer 25*b* is provided on the silver layer 25*a*, and the uppermost portion is plated with a gold (Au) layer 25*c*. Additionally, one of the pair of power supply terminals 25 is a positive terminal and the other is a negative terminal.

A pair of support holes 26 for supporting the substrate 11 on the support body 14 is formed at two, facing each other, of the four corners of the substrate 11.

Additionally, the support body 14 supporting the substrate 11 serves as a heat sink for making heat escape from the substrate 11. The support body 14 is a thick plate made of metal such as aluminum having excellent thermal conductivity, larger than the substrate 11 and formed in the shape of an approximate square for which four corners are cut.

Support holes 29 are formed at two, facing each other, of the four corners of the support body 14 so as to correspond to positions of the support holes 26 of the substrate 11, and attachment holes 30 for attaching the connectors 13 are formed at the other two corners facing each other. The support hole 29 is opened on a side face of the support body 14. The attachment hole 30 is opened on a surface of the support body 14.

An insertion portion 31, in which a part of each connector 13 is inserted and arranged, is formed in the vicinity of each attachment hole 30 on the support body 14. The insertion portion 31 is a polygonal hole penetrating from the surface to a back face of the support body 14 and is formed in the shape of an approximate rectangle in the embodiment. Each insertion portion 31 is opened at the side of the support body 14.

Additionally, the connector 13 has a connector terminal 34 and a housing 35 holding the connector terminal 34, and the terminal and the housing are integrally formed by, for example, insert molding.

The connector terminal 34 electrically connects, solderless, the power supply terminal 25 on the substrate 11 to a power supply wire 36. The connector terminal 34 has electroconductivity, is made of metal having fixed rigidity and spring performance, and is formed of a thin terminal plate made of phosphor bronze in the embodiment. The connector terminal 34 has, at its middle portion, a base portion 37 to be held by the housing 35, a contact portion 38 coming into contact with the power supply terminal 25 on the substrate 11 is formed at one end of the base portion 37, and a wire connection portion 39, to which the power supply wire 36 is connected, is formed at the other end.

The base portion 37 is formed in an approximate L-shape. The contact portion 38 is an apex portion of the terminal plate bent in an approximately V-shape and comes into contact with the power supply terminal 25. The wire connection portion 39 is formed in a manner of cylindrically bending one end of the terminal plate and bending it at a right angle from the base portion 37, and is projected on the back face 11*b* side from the surface 11*a* side of the substrate 11. A self-lock terminal type terminal piece 40 for locking and electrically connecting the power supply wire 36, which is exposed by peeling off the insulating coat and inserted in the wire connection portion 39, is formed on the wire connection portion 39.

Moreover, at least the contact portion 38 is plated with the same gold as the gold layer 25*c* formed at the uppermost portion of the power supply terminal 25 so that corrosion of inter-dissimilar materials is prevented between the connector terminal 34 and the power supply terminal 25.

The housing 35 is formed of insulative synthetic resin and has a support portion 43, which is formed of a rectangular plate, and a leg portion 44 formed integrally with and vertically projected from a back face of the support portion 43. The base portion 37 of the connector terminal 34 is held on the support portion 43, and the contact portion 38 of the connector terminal 34 is freely swingably arranged at an opening portion 45 formed in the support portion 43. The wire connection portion 39 of the connector terminal 34 is integrally embedded and held in the leg portion 44. The leg portion 44 and the wire connection portion 39 constitute a vertical portion 46 vertically projecting on the back face 11*b* side from the surface 11*a* side of the substrate 11.

The leg portion 44 is hollow, has an outer periphery that is a rectangular pillar shape, and is formed at a size that can be fitted in the insertion portion 31 of the support body 14. The leg 44 (vertical portion 46) can be laterally (in a direction indicated by the arrow A in FIG. 2(*a*)) inserted and fitted in the insertion portion 31 of the support body 14. In a state where the leg portion 44 (vertical portion 46) is fitted in the insertion portion 31 of the support body 14, the leg portion 44 is prevented from rotating in relation to the insertion portion 31 of the support body 14. The leg portion 44 (vertical portion 46) is projected from the back face 11*b* of the substrate 11, and projected on the back face side of the support body 14 through the insertion portion 31 provided in the support body 14. Thus, the wire connection portions 39 of the connector terminals 34 and the wires 36 are not located on the surface 11*a* side, on which the light emitting face 24 is provided, but on the back face 11*b* side of the substrate 11. Thus, neither the wire connection portion 39 of the connector terminal 34 nor the wire 36 blocks light radiated from the light emitting face 24 of the substrate 11, absorption of light is prevented, lowering of light emission efficiency is suppressed and light distribution is not disrupted.

Moreover, although the connector 13 is constituted by the connector terminal 34 and the housing 35 in the embodiment, it may be constituted by only the connector terminal 34. In this case, the vertical portion 46 vertically projecting on the back face 11*b* side from the surface 11*a* side of the substrate 11 is constituted by the wire connection portion 39 of the connector terminal 34. In this case, by forming an outer periphery of the wire connection portion 39, which is the vertical portion 46, in a polygonal shape, the wire connection portion 39 is prevented from rotating in relation to the insertion portion 31 of the support body 14 in a state of being fitted in the insertion portion 31 of the support body 14. Moreover, in the case where the connector 13 is constituted by only the connector terminal 34, the support body 14 may be formed of an insulating material or another insulating member may be used between the connector terminal 34 and the support body 14.

The connector 13 is set to 2 mm or lower in height from the surface 11*a* of substrate 11. A height h1 from the surface 11*a* of the substrate 11 to a surface of the housing 35 is set to 2 mm or smaller in the embodiment. The height h1 is approximately the same as the height (about 1 mm) of the light emitting face 24 of the substrate 11. When the connector 13 is higher than 2 mm in height from the surface 11*a* of the substrate 11, light radiated from the light emitting face 24 of the substrate 11 is blocked by the housings 35 of the connectors 13, the blocked light is absorbed, light emission efficiency is lowered and light distribution is disrupted. By setting the connector 13 to 2 mm or smaller in height from the surface 11*a* of the substrate 11, light radiated from the light emitting face 24 of the substrate 11 and blocked by the housings 35 of the connectors 13 is reduced, the absorption of light is prevented, lowering of the light emission efficiency is suppressed and the light distribution is not disrupted.

A fixation portion 47 is formed integrally with one end of the support portion 43 of the housing 35, and a fixation hole 48 is formed in the fixation portion 47. The fixation portion 47 is projected from the back face of the support portion 43, brought into contact with and arranged on the surface of the support body 14 along the side of the substrate 11. The connector 13 is fixed to the support body 14 in a manner of screwing screw 49 into the attachment hole 30 of the support body 14 through the fixation hole 48 of the fixation portion 47. In a state where the connector 13 is fixed to the support body 14, a height h2 from a back face of the fixation portion 47 to the back face of the support portion 43 is larger than a thickness t1 of the substrate 11 (h2>t1), and a gap s1 (s1=h2−t1) between the back face of the support body 43 and the surface 11*a* of the substrate 11 is formed. Thus, elastic force of the connector terminal 34 allows the contact portion 38 of the connector terminal 34 to be brought into contact with the power supply terminal 25 at a predetermined contact pressure. At the same time, when the connector 13 is screwed and fixed to the support body 14, no tightening force is applied to the ceramic substrate 11 and the substrate 11 can be prevented from cracking.

Additionally, in the embodiment, synthetic resin of which the housing 35 is composed is white resin obtained by adding an additive composed of titanium oxide ($TiO_2$) having a high reflectance to LCP (Liquid Crystalline Polymer) having high heat resistance. The contact pressure of the contact portion 38 of the connector terminal 34, that is, the load of a contact point, can be adjusted by changing the bending angle of the contact portion 38, and is set to about 70 g in the embodiment.

In the light emitting device 10, the substrate 11 is arranged on the support body 14, each connector 13 is attached to the support body 14, and thus the substrate 11 and the support body 14 are integrated with each other.

Figure 3:
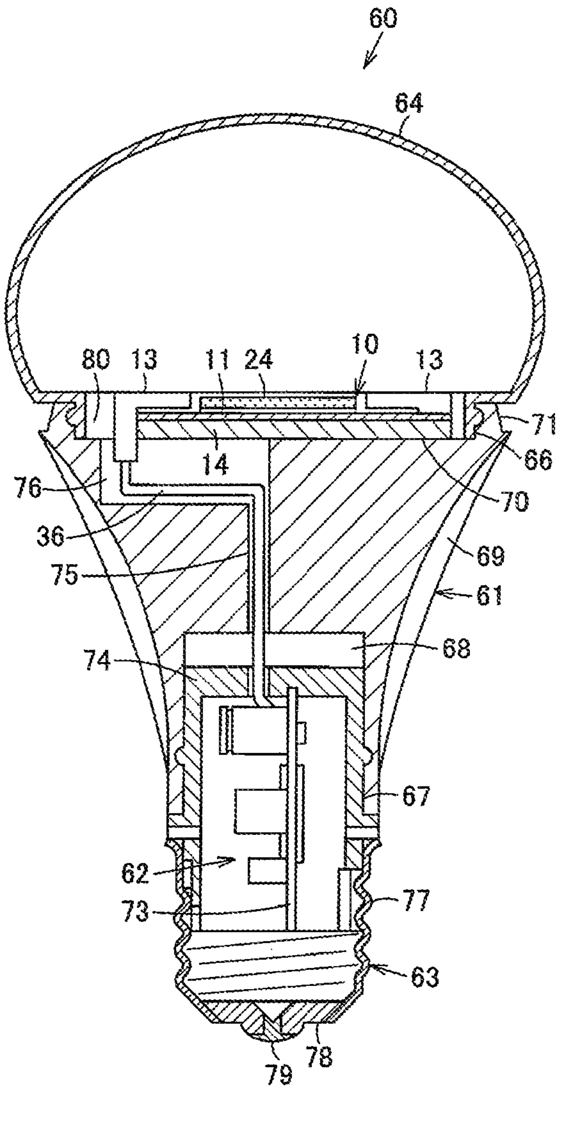
FIG. 3 is a cross sectional view showing an illumination apparatus to which the light emitting device is attached.

As shown in FIG. 3, the light emitting device 10 is used as a light source of an illumination apparatus 60 which is a lamp with a cap interchangeable with mini-krypton bulbs.

The illumination apparatus 60 includes an apparatus body 61, the light emitting device 10 attached to the apparatus body 61, a lighting device 62 for lighting the light emitting device 10, a cap 63 for supplying power to the lighting device 62, and a cover 64 constituting a globe.

The apparatus body 61 is made of metal having excellent thermal conductivity, and columnarly formed of aluminum in the embodiment. A large diameter opening portion 66 is formed at one end of the apparatus body 61, and a housing recess portion 68 having a small diameter opening portion 67 is formed at the other end thereof. An outer circumference of the apparatus body 61 is formed in the shape of an approximate cone for which the diameter is sequentially decreased from one end to the other end. That is, an external form of the apparatus body 61 is formed in a shape approximating a silhouette of a neck portion of a mini-krypton bulb. Many heat radiating fins 69 radially projecting from one end to the other end are integrally formed at the outer circumference of the apparatus body 61. A circle recess portion is foamed at one end of the apparatus body 61 by the opening portion 66, a flat substrate support portion 70 is formed inside the recess portion, and a ring-shaped projection portion 71 is formed at the circumference of the recess portion.

The light emitting device 10 is closely attached to the substrate support portion 70 of the apparatus body 61. That is, the back face of the support body 14 of the light emitting device 10 is placed on the substrate support portion 70, screws 72 (see FIG. 1(*a*)) are screwed into screw holes provided in the substrate support portion 70 through the support holes 26 of the substrate 11 and the support holes 29 of the support body 14, and the substrate 11 and the support body 14 are screwed and fixed to the apparatus body 61. Moreover, the support body 14 may be omitted, the substrate support body 70 of the apparatus body 61 itself may be made as a support body and the substrate 11 may be directly supported on the apparatus body 61.

The light emitting device 10 is reliably brought into close contact with the substrate support portion 70 of the apparatus body 61 by the screws 72, the substrate 11 composed of ceramics having excellent thermal conductivity, and thus heat generated from the light emitting element 12 can be efficiently transmitted to and radiated from the apparatus body 61. Additionally, since the substrate 11 is composed of ceramics having insulativity, a specified insulating sheet for insulating the support body 14 and the apparatus body 61, which are made of aluminum, from each other is not required to be provided, thereby providing an advantage in terms of cost.

The lighting device 62 includes a flat circuit substrate 73 on which circuit parts constituting a lighting circuit of the light emitting element 12 mounted on the substrate 11 are mounted. The lighting circuit converts an AC voltage of 100V to DC voltage and supplies the DC voltage to the light emitting element 12. The circuit substrate 73 is housed in an insulating case 74, and these are housed in the housing recess portion 68 of the apparatus body 61. Additionally, the power supply wires 36 for supplying power to the light emitting element 12 are connected to output terminals of the circuit substrate 73, and an input line (not shown) for connecting the substrate 73 to the cap 63 is connected to an input terminal thereof.

The wire 36 for supplying power to the light emitting element 12 is led out to the opening portion 66 of the apparatus body 61 through a through-hole 75 and a guide groove 76 formed in the apparatus body 61, and a leading end of the power supply wire 36 exposed by peeling off the insulating coat is inserted in the wire connection portion 39 of the connector 13. Thus, the wire 36 is locked to the self-lock terminal type terminal piece 40 on the wire connection portion 39 and electrically connected to the connector terminal 34 (see FIG. 2(*a*)). Moreover, wire connection work is performed before the substrate 11 is attached to the substrate support portion 70.

The wire connection work can be efficiently and reliably performed in a manner of laterally attaching the connectors 13 to the substrate 11, preventing the connectors 13 from rotating in relation to the support body 14 and employing a self-lock terminal method for connection of the connector 13 and the wire 36. That is, since the leg portion 44 (vertical portion 46) of the connector 13 can be laterally inserted and fitted in the insertion portion 31 of the support body 14, troublesome work that the leg portion 44 (vertical portion 46) is made to penetrate from the surface side to the back face side of the support body 14 is not required. Additionally, since the self-lock terminal method is employed for connecting the wire 36 to the connector terminal 34, troublesome work that the wire 36 is soldered to, welded to or wrapped around the connector terminal 34 is not required. Further, since the leg portion 44 (vertical portion 46) having a rectangular outer periphery is fitted in the insertion portion 31 (rectangular hole) of the support body 14, the connector 13 does not rotate in relation to the support body 14 when the wire 36 is connected to the connector terminal 34. Thus, the wire connection work can be easily and reliably performed. Moreover, although the wire connection work may be performed manually, a harness component can be constituted by connecting the wire 36 to the connector 13 in advance and a series of actions of the above connection work can be automated.

The cap 63 is an Edison type E17 cap, and includes a shell 77 including a thread and made of sheet copper, and a conductive eyelet 79 provided at a top portion of a lower end of the shell 77 via an insulating portion 78. The input line (not shown) led out from the input terminal of the circuit substrate 73 of the lighting device 62 is connected to the shell 77 and the eyelet 79.

The cover 64 constitutes the globe for covering the light emitting device 10, is made of milky white polycarbonate, and is formed in the shape of an ellipsoid having an opening portion 80 at its one end and having a smooth curved surface approximating a silhouette of a mini-krypton bulb. An edge of the opening portion 80 of the cover 64 is fitted in the projection portion 71 of the apparatus body 61 and fixed thereto by adhesive or the like.

The illumination apparatus 60 using the light emitting device 10 as a light source is thus formed. That is, the lamp with a cap is formed which includes the globe, which is the cover 64, at one end and the E17 cap 63 at the other end, has an external form wholly approximating a silhouette of a mini-krypton bulb and is interchangeable with mini-krypton bulbs.

When the illumination apparatus 60 is turned on, power is supplied to the lighting device 62 through the cap 63, the lighting device 62 is activated to output a DC voltage of 43V. The DC voltage is applied from the power supply wires 36 connected to the output terminals of the lighting device 62 to the light emitting element 12 through the connector terminals 34 of the connectors 13 and the power supply terminals 25. Thus, all the LEDs of the light emitting element 12 are simultaneously lit and white light is radiated from the light emitting face 24.

Here, since the wire connection portions 39 of the connector terminals 34 and the wires 36 are not located on the light emitting face 24 side but on the back face 11*b* side of the substrate 11, neither shadows of the wire connection portion 39 nor the wire 36 are reflected on the cover 64. Additionally, since the connector 13 can be set to about 2 mm or lower in height from the surface 11*a* of the substrate 11, a shadow of the connector 13 reflected on the cover 64 can be made small. Accordingly, with the illumination apparatus 60, lowering of light emission efficiency is suppressed and light distribution is not disrupted.

When the illumination apparatus 60 is lit, the light emitting element 12 generates heat. The heat is transmitted from the substrate 11 made of ceramics having excellent thermal conductivity to the apparatus body 61 through the support body 14, and effectively radiated into the air from the outer circumference, at which the heat radiating fins 69 are provided, of the apparatus body 61.

According to the light emitting device 10 of the embodiment, without use of conventional connectors, that is, without use of solder, the substrate 11 and the power supply wires 36 can be electrically connected to each other by the solderless connectors 13. Thus, temperature limitations for keeping the reliability of solder are eliminated and the junction temperature of the substrate 11 can be raised. Thus, as a material of the substrate 11, ceramics can be employed which radiates a slight amount of outgas and can raise the junction temperature.

Since a problem is thus removed that, although the substrate 11 having heat resistance is used, the junction temperature cannot be raised due to the temperature limitations of solder, there can be provided the light emitting device 10 having excellent heat resistance. Thus, by using the light emitting device 10 as, for example, a light source for various bulbs used in an emergency such as a fire, or a light source of a guide light or an emergency light, there can be provided an illumination apparatus having necessary heat resistance.

Since an electric connection can be realized by the solderless connector 13 without use of a conventional connector fixed to the substrate 11 by solder, there can be provided the low-cost light emitting device 10 and illumination apparatus.

Since the wire connection portions 39 of the connector terminals 34 and the wires 36 are not located on the light emitting face 24 side but on the back face 11*b* side of the substrate 11, neither shadows of the wire connection portion 39 nor the wire 36 are reflected on the cover 64. Additionally, since the connector 13 can be set to about 2 mm or lower in height from the surface 11*a* of the substrate 11, a shadow of the connector 13 reflected on the cover 64 can be made small. Accordingly, with the illumination apparatus 60, lowering of light emission efficiency is suppressed and light distribution is not disrupted. At the same time, since the plurality of LEDs of the light emitting element 12 are, by the COB technology, arranged in a matrix shape and mounted on the surface 11*a* of the substrate 11, light emitted from each LED of the light emitting element 12 is approximately evenly radiated to the whole inner face of the cover 64 and diffused by the milky white cover 64, and illumination can be performed with a light distribution property approximating that of a mini-krypton bulb.

Since the leg portion 44 (vertical portion 46) of the connector 13 can be laterally inserted and fitted in the insertion portion 31 of the support body 14, troublesome work that the leg portion 44 (vertical portion 46) is made to penetrate from the surface side to the back face side of the support body 14 is not required. Since the leg portion 44 (vertical portion 46) having a rectangular outer periphery is fitted in the insertion portion 31 (rectangular hole) of the support body 14, the connector 13 does not rotate in relation to the support body 14 in connecting the wire 36 to the connector terminal 34 and the connection work can be easily performed. By these effective constitutions and employment of the self-lock terminal method for connection of the connector 13 and the wire 36, the connection work of the connector 13 and the wire 36 can be efficiently and reliably performed and workability of wire connection can be further improved. Additionally, a series of actions of the connection work can be automated, and cost reduction can be realized with use of an automation machine.

Since the substrate 11 is composed of ceramics having insulativity, no short is caused, the solderless connector 13 can be used, and no electrical insulation is required to be performed between the substrate 11 and the wiring pattern and between the substrate 11, the aluminum support body 14 and the aluminum apparatus body 61, thereby providing an advantage in terms of cost.

Since the substrate 11 is composed of ceramics having excellent thermal conductivity, the substrate 11 is reliably brought into close contact with the apparatus body 16 via the support body 14 and heat generated by the light emitting element 12 can be effectively transmitted to the apparatus body 61 and radiated. By the effective heat radiation operation, there can be provided an illumination apparatus in which temperature rise and temperature unevenness of the light emitting element 12 are prevented, lowering of light emission efficiency is suppressed, lowering of the illuminance by reduction of luminous flux can be prevented and a predetermined luminous flux can be sufficiently obtained. At the same time, the life of the light emitting element 12 can be lengthened.

Figure 4:
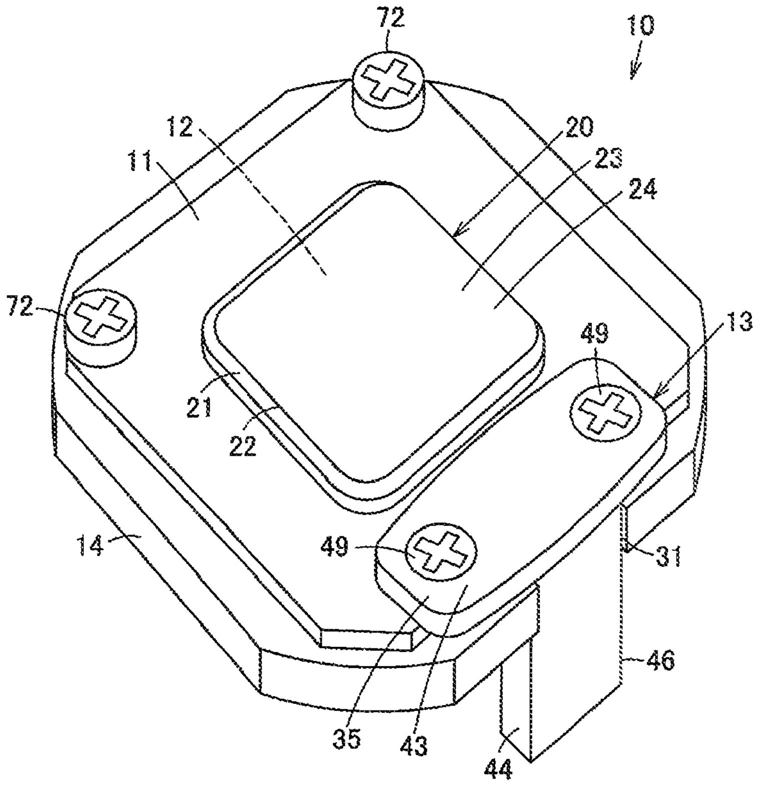
FIG. 4 is a perspective view showing a light emitting device of a second embodiment.

FIG. 4 shows a second embodiment. Moreover, the same symbols are attached to the same constitutions as those of the first embodiment, and description thereof will be omitted.

Although the positive power supply terminal 25 and the negative power supply terminal 25 are led out from both the side edges, facing each other, of the substrate 11 and the connectors 13 for both electrodes are provided in the first embodiment, they are led out from the substrate 11 in the same direction and a both-electrodes integrated connector 13 is provided in the second embodiment.

In the connector 13, the connector terminals 34 of both the electrodes and the housing 35 are integrally formed, an integrated leg portion 44 (vertical portion 46), in which the wire connection portions 39 of the connector terminals 34 of both the electrodes are arranged, is formed in a rectangular parallelepiped shape. Additionally, also the insertion portion 31 of the support body 14 is formed in a rectangular hole shape so that the leg portion 44 can be inserted in the insertion portion 31.

According to the embodiment, since the respective wires 36 of the positive side and the negative side can be connected in the same direction and the connector 13 is not constituted by two parts but by one part, the number of parts can be reduced, attachment work of the connector 13 to the support body 14 and the substrate 11 is performed only once and the workability can be improved, thereby providing an advantage in terms of cost.

Figure 5:
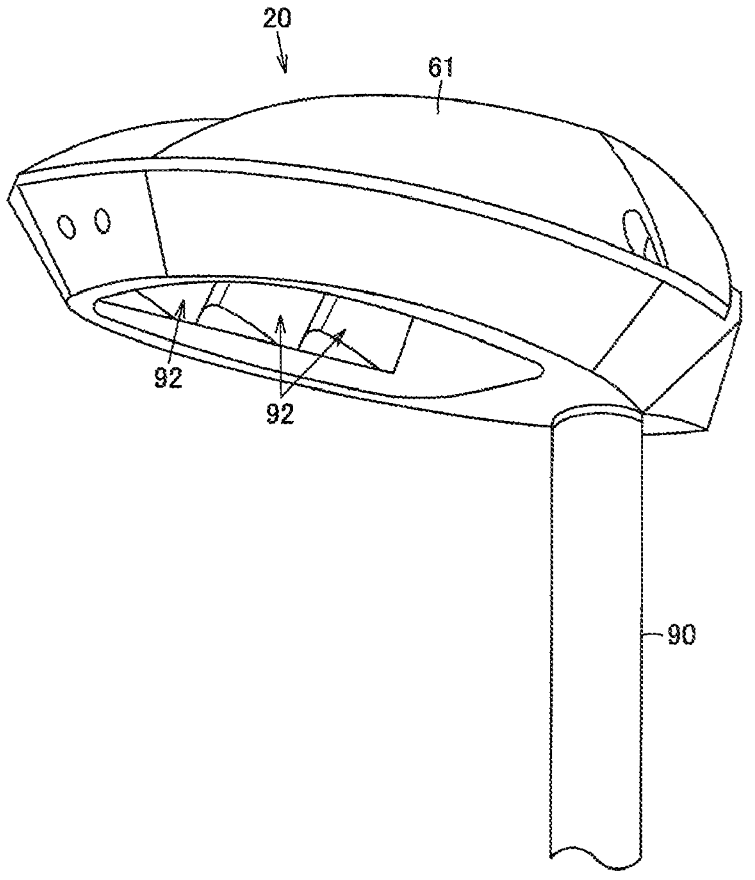
FIG. 5 is a perspective view of an illumination apparatus to which a light emitting device of a third embodiment is attached.
Figure 6:
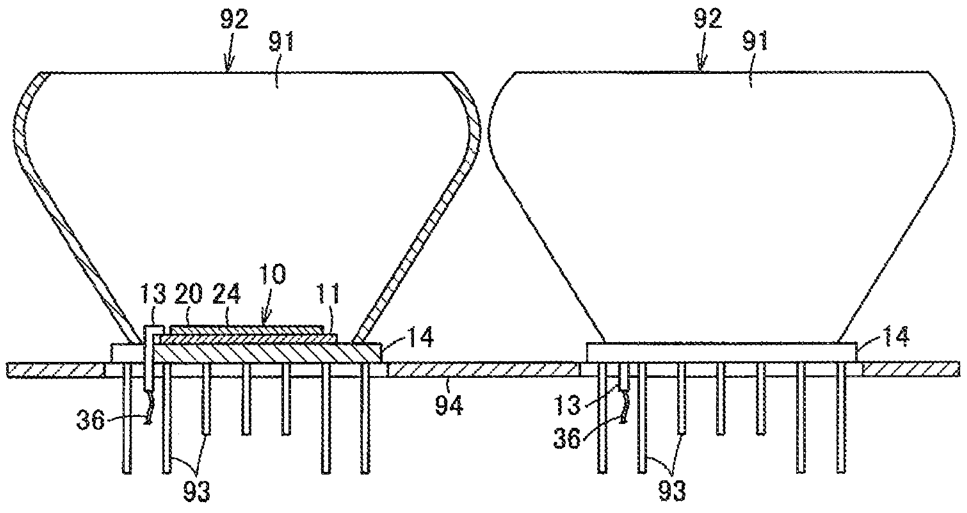
FIG. 6 shows the light emitting device of the illumination apparatus, FIG. 6(*a*) is a partial cross sectional view of the light emitting device and an optical unit and FIG. 6(*b*) is a perspective view of the light emitting device.
Figure 6:
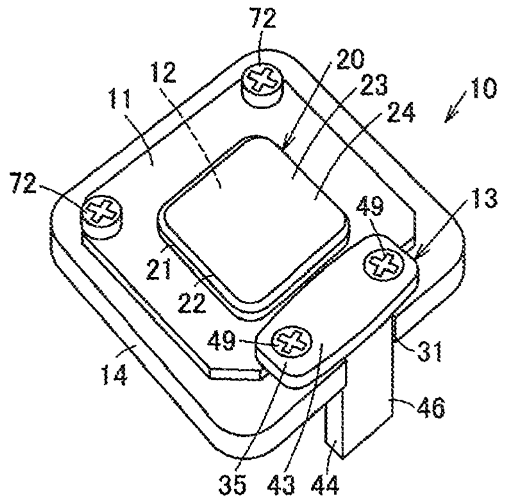

FIGS. 5 and 6 show a third embodiment. Moreover, the same symbols are attached to the same constitutions as those of the above-described embodiments, and description thereof will be omitted.

Although the substrate 11 of the light emitting device 10 is composed of ceramics in the above-described embodiments, it may be composed of metal such as aluminum, aluminum alloy, copper or copper alloy having excellent thermal conductivity. Hereinafter, regarding the third embodiment, the light emitting device 10 including the substrate 11 formed of aluminum and the illumination apparatus 60 using the light emitting device 10 will be described.

As shown in FIG. 5, the illumination apparatus 60 is a road light in which the apparatus body 61 housing the light emitting device 10 is provided at an upper end of a pole 90.

As shown in FIG. 6, in the light emitting device 10, the substrate 11 is formed of aluminum, the surface (back face) of the support body 14 is formed in an approximately square shape, and the other portions have the same constitutions as those of the both-electrodes integrated light emitting device 10 shown in FIG. 4. Moreover, since the aluminum has electro-conductivity, the substrate 11 having insulativity similar to ceramics is formed by coating both the surface and the back face of the substrate 11 with epoxy resin.

The substrate 11 is brought into close contact with and supported by the support body 14 in the light emitting device 10, and a reflection body 91 is provided so as to enclose the light emitting device 10. An optical unit 92 is constituted by the light emitting device 10 and the reflection body 91. A plurality of heat radiating fins 93 are integrally provided on the back face side of the support body 14.

The plurality of optical units 92 having similar constitutions are provided on an attachment plate 94 made of metal such as stainless steel having thermal conductivity. The plurality of light emitting devices 10 are provided on the attachment plate 94 so that desired light distribution is obtained in the apparatus body 61 of the illumination apparatus 60.

According to the third embodiment, the same effects as those of the above-described embodiments can be obtained. Since the substrate 11 can be composed of metal such as aluminum at less expense than ceramics, advantage can be obtained in terms of cost in the case of using the light emitting devices 10 for the illumination apparatus 60 used as a large and costly road light.

Figure 7:
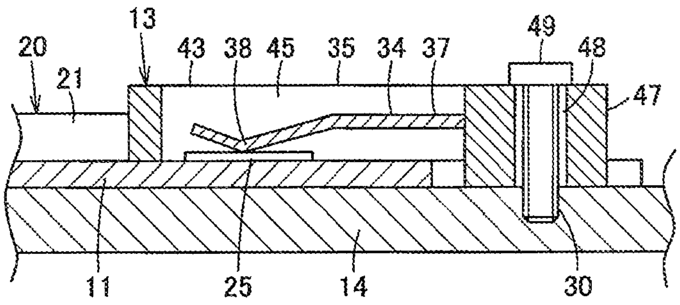
FIG. 7 shows a light emitting device of a fourth embodiment and is a cross sectional view corresponding to FIG. 2(*c*).

FIG. 7 shows a fourth embodiment. Moreover, the same symbols are attached to the same constitutions as those of the above-described embodiments, and description thereof will be omitted.

In the fourth embodiment, the connector 13 has a function of fixing the substrate 11 to the support body 14.

As shown in FIG. 7, in the connector 13, no gap exists between the back face of the support portion 43 of the housing 35 and the surface 11*a* of the substrate 11. Thus, by screwing the screw 49 into the support body 14 through the fixation hole 48 of the fixation portion 47 of the housing 35, the support portion 43 comes into contact with the substrate 11 and the substrate 11 is pressed against the support body 14. Thus, the connector 13 can be provided with the function of fixing the substrate 11 to the support body 14 and the substrate 11 can be further reliably supported on the support body 14. At the same time, since the connector 13 can fix the substrate 11 to the support body 14, advantage is obtained in terms of cost.

Although the above constitution is preferably used in the case of using the substrate 11 formed of metal such as aluminum and does not crack, it can be used, by properly adjusting the pressing force, etc., also in the case of using substrate 11 formed of ceramics.

An experiment for checking the light emission efficiency and workability of the light emitting device 10 of each embodiment was performed. In the experiment, the connector terminals 34 composed of phosphor bronze were used. The power supply terminals 25 on the substrate 11 were plated with gold, and also the contact portions 38 of the connector terminals 34 were similarly plated with gold. The contact pressure of the contact portion 38 of the connector terminal 34 against the power supply terminal 25, that is, the load of a contact point, was set to about 70 g. The housing 35 of the connector 13 was composed of white resin obtained by adding titanium oxide to LCP.

Lighting conditions were set as follows: a rated current of 70 mA; a rated voltage of 43V; a withstand voltage of the connector 13 of 1700V or higher; an insulation resistance of 100 MΩ or larger; a highest use temperature of the contact point of 110° C.; halogen-free resin composing the light emitting device 10; and a creeping distance (clearance) of 2 mm or longer. Moreover, the temperature of the contact point indicates the temperature of the power supply terminal 25 in a state where the contact portion 38 of the connector terminal 34 comes into contact with the power supply terminal 25.

Under the above conditions, the light emission efficiencies and workabilities were compared regarding examples, Convention 1 (wiring direction: lateral, height h1 of connector: 4 mm), Example 1 (wiring direction: downward, height h1 of connector: 4 mm, shape of resin on wire side: round), Example 2 (wiring direction: downward, height h1 of connector: 2 mm, shape of resin on wire side: round) and Example 3 (wiring direction: downward, height h1 of connector: 2 mm, shape of resin on wire side: four-sided). The comparison results are indicated by the table in FIG. 8.

Moreover, the lateral wiring direction indicates that the wire connection portion 39 of the connector terminal 34 is led out in parallel with the surface 11*a* of the substrate 11. The downward wiring direction indicates that the wire connection portion 39 of the connector terminal 34 is projected on the back face 11*b* side of the substrate 11 as shown in FIG. 1 showing the first embodiment. The shape of resin on the wire side indicates a shape of a lateral cross section of the leg portion 44 (vertical portion 46). Additionally, the light emission efficiency indicates a value in the case where the light emission efficiency of Convention 1 is set as 100. The workability is checked in the case of connecting the wire 36 to the wire connection portion 39 of the connector terminal 34.

As shown in FIG. 8, in Example 3 (wiring direction: downward, height h1 of connector: 2 mm, shape of resin on wire side: four-sided), it was checked that neither the wire connection portion 39 of the connector terminal 34 nor the wire 36 blocks light emitted from the light emitting face 24 of the substrate 11, high light emission efficiency is obtained, the wire connection portion 39 of the connector terminal 34 does not rotate and excellent workability is obtained.

Additionally, also regarding the both-electrodes integrated light emitting device shown in FIG. 4, the same results could be obtained. Although the aluminum and ceramic substrates 11 were used, the same results could be obtained regarding these substrates 11. Additionally, even when the above-described solderless connecting method was employed and LEDs each having a service life of 40000 hours were used as the light emitting element 12, excellent results almost the same as the above results were obtained.

Moreover, although it is suitable that the light emitting element 12 is constituted by, for example, light emitting diode chips each including a gallium nitride (GaN)-based semiconductor emitting blue light, a light emitting element using a semiconductor laser, an organic EL or the like as a light emitting source may be used.

In the case where LEDs are used as the light emitting element 12, some or all of the LEDs may be arranged and mounted, with use of the COB (Chip On Board) technology, in accordance with a fixed rule, for example, in a matrix shape, zigzag shape, radial shape or the like, or the LEDs may constitute an SMD (Surface Mount Device). When the SMD is used, although a plurality of LED elements are preferably used, the number of elements may be properly selected in accordance with uses of illumination. For example, it is allowed that four elements constitute an element group and one or more element groups is/are used. Additionally, the SMD may be constituted by only one element.

Although the light emitting device 12 preferably emits white light, it may emit red light, blue light, green light or light of a combination of the colors in accordance with uses of illumination.

The substrate 11 may consist of ceramics composed of an insulative sintered compact of aluminum nitride, silicon nitride, alumina, a compound of alumina and zirconia or the like, or the like. The material, constitution and mounting means of the substrate 11 are not limited. For example, as the material, not only ceramics but also metal such as aluminum, aluminum alloy, copper, copper alloy or the like insulated with epoxy resin or the like may be employed. Alternatively, the substrate 11 may be composed of synthetic resin such as epoxy resin or an insulative material such as a glass epoxy material or paper phenol material. Additionally, the substrate 11 may be circular, four-sided, six-sided, polygonal or elliptical in order to constitute a point or face module. Any shape is applicable if desired light distribution is obtained by it.

Although the connector terminal 34 of the connector 13 is preferably composed of, for example, phosphor bronze having a fixed rigidity and spring performance, it may be constituted by a conductive thin metal plate composed of stainless steel or the like having elasticity. Additionally, although the contact portion 38 coming into contact with the power supply terminal 25 on the substrate 11 is preferably formed by bending a terminal plate in a V-shape, it may be formed by, for example, projecting a part of the terminal plate with use of a punch.

Although the wire connection portion 39 to which the power supply wire 36 is connected is vertically projected on the back face 11*b* side from the surface 11*a* side of the substrate 11, it is not strictly required to be vertically projected and may be obliquely projected. That is, the wire connection portion 39 may be projected on the back face 11*b* side of the substrate 11 so that light is not blocked on the surface 11*a* side of the substrate 11.

Although a self-locking terminal method in which the wire 36 exposed by peeling off the insulating coat can be connected by only being inserted is preferably employed for the wire connection portion 39, the wire 36 may be connected to the wire connection portion 39 by a method such as welding or wrapping. More reliable connection may be kept by combining the methods with each other.

It is suitable to set the contact pressure of the contact portion 38 of the connector terminal 34 against the power supply terminal 25, that is, the load of a contact point, to 70 to 200 g. When the contact pressure is smaller than 70 g, there is a possibility that an oxide layer on the power supply terminal 25 cannot be removed during the contact and poor contact is caused. On the other hand, when the contact pressure is larger than 200 g, there is a possibility that the ceramic substrate 11 is cracked.

Although the load of the contact point can be adjusted by changing the bending angle of the contact portion 38 of the connector terminal 34, it may be adjusted by, for example, selecting a material of the contact terminal 34 or changing the shape thereof, and adjusting means of the load is not limited to the above means.

The housing 35 of the connector 13 is preferably formed of a material which is white and has a high reflectance in order to improve light emission efficiency, and it is suitable to use, for example, a material which is obtained by adding an additive such as titanium oxide ($TiO_2$) having a high reflectance to LCP or nylon-based resin having high heat resistance. However, it is allowed that connector 13 does not include the housing 35 and includes only the connector terminal 34.

Although the connector 13 is set to about 2 mm or lower in height from the surface 11*a* of the substrate 11, the height of the connector 13 having the housing 35 is the height of the housing 35, and the height of the connector 13 not having the housing 35 is the height up to the connector terminal 34. The connector 13 is preferably 2 mm or lower in height, more preferably, 1.5 mm in height in consideration of the constitution and shape of the connector 13 and the height (about 1 mm) of the light emitting face 24 of the substrate 11.

Although the connector 13 cannot be rotated by polygonally forming the outer periphery of the vertical portion 46 of the connector 13 and fitting the vertical portion 46 in the polygonal insertion portion 31 of the support body 14 attached to the substrate 11, the insertion portion in which the vertical portion 46 is fitted may not be provided in the support body 14 but in the substrate 11.

Although each of the vertical portion 46 and the insertion portion 31 is formed in a polygonal shape, for example, a four-sided shape or a six-sided shape, the shape is not limited to these shapes, and, for example, a vertical portion 46 as a projection portion may be fitted in an insertion portion 31 as a recess portion. That is, any polygonal shape or constitution is applicable if it can prevent the connector 13 from rotating.

It is preferable to form the insertion portion, which is provided in the support body 14 or substrate 11, by, for example, notching the edge of the support body 14 (substrate 11) and to laterally insert the vertical portion 46 of the connector 13 in the insertion portion, because the light emitting device 10 can be downsized and attachment work of the connectors 13 to the substrate 11 can be simplified. However, the insertion portion may be constituted by a through-hole without notching the edge of the support body 14 or substrate 11.

The illumination apparatus of the present invention is applicable to: a self-ballasted illumination apparatus interchangeable with general incandescent bulbs; a small illumination apparatus for general illumination used as a home illumination apparatus such as a downlight or spotlight; a relatively large illumination apparatus used in an office or the like, in which whole illumination is performed from a ceiling or the like, or used for facilities, businesses or the like; and a large illumination apparatus such as a road light for highways, general roads or the like, or a security light for illuminating an outdoor facility such as a park. Further, the illumination apparatus of the present invention is applicable not only to the above-described illumination apparatuses but also to various illumination apparatuses, for example, a backlight of a thin shape television, liquid crystal display, mobile phone or various types of information terminals, an illumination apparatus for indoor/outdoor signboard advertisements, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device comprising:

a substrate including a surface on which a plurality of power supply terminals are formed and a back face opposite the surface;

a light emitting element mounted on the surface of the substrate;

a plurality of connectors, each of the plurality of connectors including:

a contact portion coming into contact with one of the plurality of power supply terminals on the surface of the substrate;

a connector terminal including a wire connection portion projecting on the back face side of the substrate; and a vertical portion projecting on the back face side from the surface side of the substrate, wherein an outer periphery of the vertical portion is polygonally formed, the wire connection portion is arranged in the vertical portion, and a power supply wire is connected to the wire connection portion; and a body to which the back face side of the substrate is attached, the body including a peripheral edge portion, the peripheral edge portion including a plurality of notches, each of the plurality of notches corresponding to the shape of one of the plurality of vertical portions, wherein each of the plurality of vertical portions is disposed in one of the plurality of notches.

2. The light emitting device according to claim 1, wherein each of the plurality of connectors is 2 mm or lower in height from the surface of the substrate.

3. An illumination apparatus comprising:

an apparatus body; and the light emitting device according to claim 1 attached to the apparatus body.

* * * * *